United States Patent [19]

Oshima et al.

[11] Patent Number: 5,100,957

[45] Date of Patent: Mar. 31, 1992

[54] PROTECTIVE DUST COVER FOR PHOTOMASK OR RETICLE

[75] Inventors: Noriaki Oshima, Yokohama; Masaki Uchikura, Sagamihara; Hideki Ohno, Yokohama, all of Japan

[73] Assignee: Tosoh Corporation, Shin-nanyo, Japan

[21] Appl. No.: 734,015

[22] Filed: Jul. 22, 1991

Related U.S. Application Data

[63] Continuation of Ser. No. 189,850, May 3, 1988, abandoned.

[51] Int. Cl.$^5$ .............................. C08F 8/00
[52] U.S. Cl. ...................................... 525/61
[58] Field of Search ........................... 525/61

[56] References Cited

U.S. PATENT DOCUMENTS

| | | | |
|---|---|---|---|
| 4,413,091 | 11/1983 | Iwasaki et al. | 525/61 |
| 4,665,124 | 5/1987 | Walls et al. | 525/61 |
| 4,844,828 | 7/1989 | Aoki | 525/61 X |

FOREIGN PATENT DOCUMENTS

| | | | |
|---|---|---|---|
| 0121139 | 10/1984 | European Pat. Off. | |
| 0122613 | 10/1984 | European Pat. Off. | |
| 0140531 | 5/1985 | European Pat. Off. | 525/61 |
| 0216083 | 4/1987 | European Pat. Off. | 525/61 |
| 0221651 | 5/1987 | European Pat. Off. | 525/61 |
| 0010593 | 5/1965 | Japan | 525/60 |
| 0138091 | 10/1979 | Japan | 525/61 |
| 0003802 | 1/1982 | Japan | 525/61 |
| 0030706 | 2/1982 | Japan | 525/61 |
| 0098306 | 6/1983 | Japan | 525/61 |
| 0098307 | 6/1983 | Japan | 525/61 |
| 2141004 | 6/1987 | Japan | 525/61 |
| 0159501 | 10/1951 | U.S.S.R. | 525/61 |
| 0431186 | 11/1974 | U.S.S.R. | 525/61 |

*Primary Examiner*—Joseph L. Schofer
*Assistant Examiner*—J. M. Reddick
*Attorney, Agent, or Firm*—Oblon, Spivak, McClelland, Maier & Neustadt

[57] ABSTRACT

A protective dust cover for a photomask or reticle useful for forming semiconductor integrated circuits, which is a transparent thin film cover to be disposed with a certain distance from the substrate surface of the photomask or reticle for the protection and dust proof of the substrate surface, said transparent thin film consisting essentially of a polyvinyl acetal of the formula:

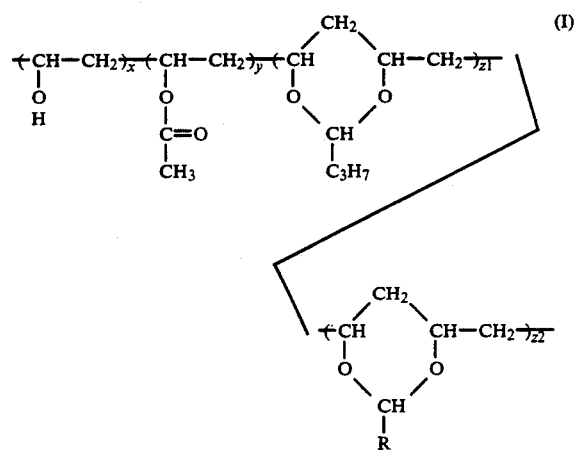

wherein R is a hydrogen atom, $-CH_3$, $-C_2H_5$ or $-C_nH_mF_{2n-m+1}$ wherein n is an integer of from 1 to 8 and m is an integer of from 0 to 2n, x is a number of from 5 to 40, y is a number of from 0 to 10, z1 is a number of from 0 to 90/2, and z2 is a number of from 3/2 to 95/2, having a vinyl acetate content of at most 10 mol % and an acetal content of at least 60 mol %.

4 Claims, 5 Drawing Sheets

PROTECTIVE DUST COVER FOR PHOTOMASK OR RETICLE

This application is a continuation of application Ser. No. 07/189,850, filed May 3, 1988, now abandoned.

The present invention relates to a protective dust cover for a photomask or reticle (hereinafter sometimes referred to simply as a mask) to be used in a lithography step for the production of semiconductor integrated circuits.

In the production of semiconductor integrated circuits, a step of patterning a semiconductor wafer coated with a resist by exposure to light is an important step influential to the yield of the integrated circuits. If a scratch mark or dust is present on the mask as the original pattern sheet, such a scratch mark or foreign matter will be printed on the wafer together with the pattern, thus leading to short circuiting or disconnection of the circuits thereby formed. Accordingly, the protection and dust proof of the mask are very important subjects for the improvement of the productivity. Particularly in the case of a stepper system wherein the same reticle is used repeatedly for the formation of patterns on a sheet of wafer, if there exists a scratch mark or dust on the reticle, all the circuits formed on the wafer will be defective. Therefore, scratch marks or deposition of dust on the reticle must be avoided as far as possible.

Under these circumstances, it has been recently proposed to cover one side or both sides of the mask with a transparent plastic thin film for the protection and dust proof of the mask, and such a proposal is being practically employed. If the distance between the mask and the plastic thin film is sufficiently large so that even if dust is deposited on the plastic thin film, the dust will be out of focus of the optical system of the exposure apparatus, the dust will not be printed on the wafer. Further, it is possible to omit a step of washing for the removal of dust deposited on the mask which used to be required, and the production process can thereby be simplified. Thus, usefulness of this method has been realized.

The plastic thin film used for the protection and dust proof of a mask is required to have no substantial absorption within the wavelength region of the light source of the exposure apparatus used and to be transparent and have adequate durability not to undergo degradation or coloring. Reflecting refinement of semiconductor circuits in recent years, the wavelength of the light source for exposure tends to be progressively short. Accordingly, the thin film is desired to have high transparency and durability not only in the conventional near ultraviolet region but also in the far ultraviolet region. Further, the plastic thin film usually has a thickness of at most 10 μm, and adequate strength is required so that even with such an extremely thin film thickness, the protective dust cover does not easily undergo deformation or fructure during its handling or during dust removal operation by e.g. an air gun.

On the other hand, in order to produce a uniform plastic thin film having no defect or irregularity in good yield, the plastic thin film is required to have not only high mechanical strength but also sufficient releasability. Namely, the most effective means to obtain a uniform plastic thin film having no irregularity is a method wherein a plastic dissolved in a volatile solvent is cast on a flat smooth substrate such as a silicon wafer, a glass sheet or a metal plate, and the thin film formed on the substrate after the evaporation of the solvent is peeled off. However, if the thin film does not have sufficient strength or releasability, it is extremely difficult to peel such a thin film from the substrate without bringing about any defect.

Heretofore, nitrocellulose, cellulose acetate, polyethylene terephthalate, polypropylene, parylene, polyvinyl butyral, polymethyl methacrylate, etc. have been known as materials for thin plastic films used for the protection and dust proof of masks. Among them, nitrocellulose has been mainly used. Material such as nitrocellulose is useful in the conventional near ultraviolet region, but it is not useful in a far ultraviolet region since it shows absorption in a far ultraviolet region and is likely to be rapidly colored or degrated under irradiation with far ultraviolet rays. On the other hand, polyvinyl butyral has excellent transparency within a wide wavelength region ranging from a near ultraviolet region to a far ultraviolet region, but it has a drawback that since its thin film is poor in the strength and elasticity, the film is likely to undergo enlongation, wrinkling or fructure during the handling or during the removal of dust by e.g. an air gun. Further, polyvinyl butyral has strong adhesiveness to a silicon wafer, a glass sheet or a metal plate used as a substrate for the preparation of the thin film, and the thin film can not readily be released from such a substrate, whereby it has been difficult to produce a uniform defectless protective dust cover for a mask in good yield.

As described in the foregoing, there has been discovered no protective dust cover which has excellent transparency and adequate durability in a wide wavelength region ranging from a near ultraviolet region to a far ultraviolet region and which is capable of being produced without defects in good yield.

It is an object of the present invention to overcome the difficulties of the conventional protective dust cover for a mask in the transparency, durability, strength and productivity and to provide a protective dust cover for a mask which has excellent transparency and durability in a wide wavelength region ranging from a near ultraviolet region to a far ultraviolet region and which has excellent mechanical strength and productivity.

The present inventors have conducted extensive researches with an aim to obtain a protective dust cover for a mask having excellent transparency, durability and strength. As a result, it has been found that thin films made of polyvinyl acetals of acetaldehyde and propionaldehyde, and polyvinyl mixed acetals of butylaldehyde/formaldehyde, butylaldehyde/acetaldehyde, butylaldehyde/propionaldehyde and butylaldehyde/fluorinated aliphatic aldehyde (hereinafter sometimes referred to generally as polyvinyl acetals) not only have excellent transparency, durability and strength in a wide wavelength region ranging from a near ultraviolet region to a far ultraviolet region but also have excellent releasability from the film-forming substrate, whereby uniform defectless protective dust covers for masks can readily be obtained. The present invention has been accomplished on the basis of this discovery.

The present invention provides a protective dust cover for a photomask or reticle useful for forming semiconductor integrated circuits, which is a transparent thin film cover to be disposed with a certain distance from the substrate surface of the photomask or reticle for the protection and dust proof of the substrate surface, said transparent thin film consisting essentially of a polyvinyl acetal of the formula:

wherein R is a hydrogen atom, $-CH_3$, $-C_2H_5$ or $-C_nH_mF_{2n-m+1}$ wherein n is an integer of from 1 to 8 and m is an integer of from 0 to 2n, x is a number of from 5 to 40, y is a number of from 0 to 10, z1 is a number of from 0 to 90/2, and Z2 is a number of from 3/2 to 95/2, having a vinyl acetate content of at most 10 mol % and an acetal content of at least 60 mol %. The ratios of parenthesized recurring units accompanied with z1 and z2 should be 2-fold on molarity base than the values of z1 and z2, respectively, because the units contain 2 sub-units resulting from vinyl alcohol, on which contents the molarity ratios are calculated.

Now, the present invention will be described in detail with reference to the preferred embodiments.

In the accompanying drawings.

Figure 1:
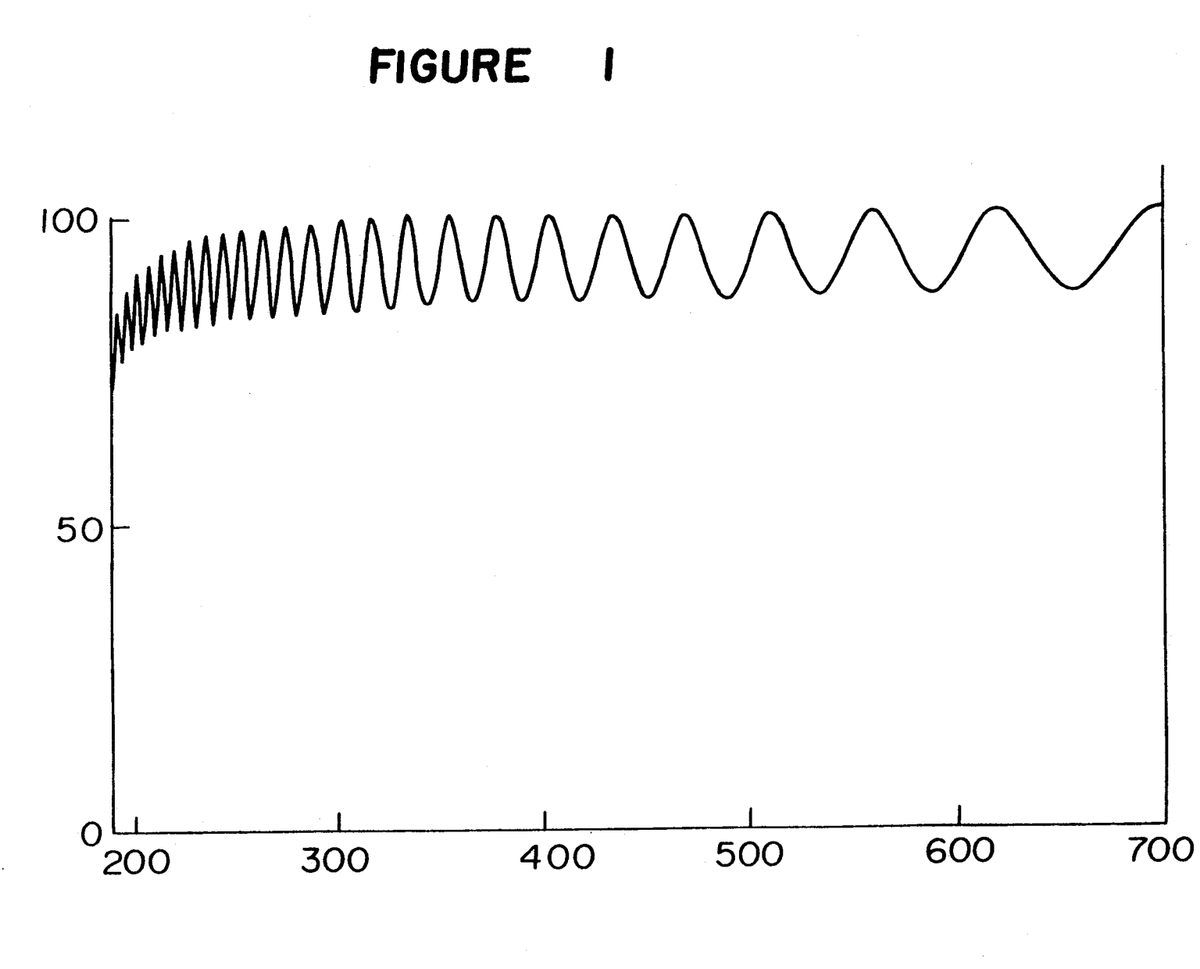
FIGS. 1, 2, 3, 4 and 5 show ultraviolet transmittance curves of protective dust covers for masks obtained in Examples 1, 3, 6, 7 and 9, respectively. As is apparent from these Figures, the protective dust covers of the present invention have excellent transparency within a wide wavelength region ranging from 190 nm to 700 nm.
Figure 2:
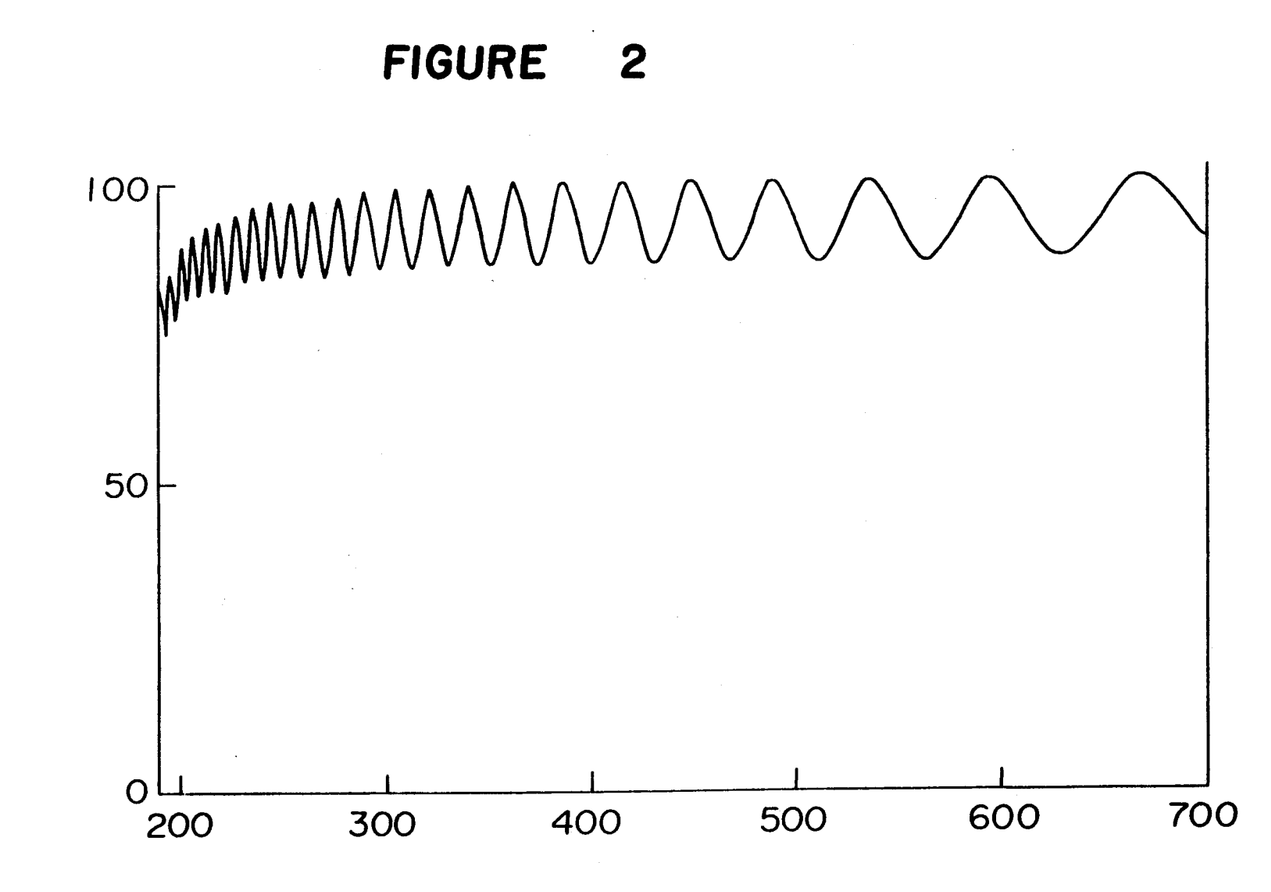
Figure 3:
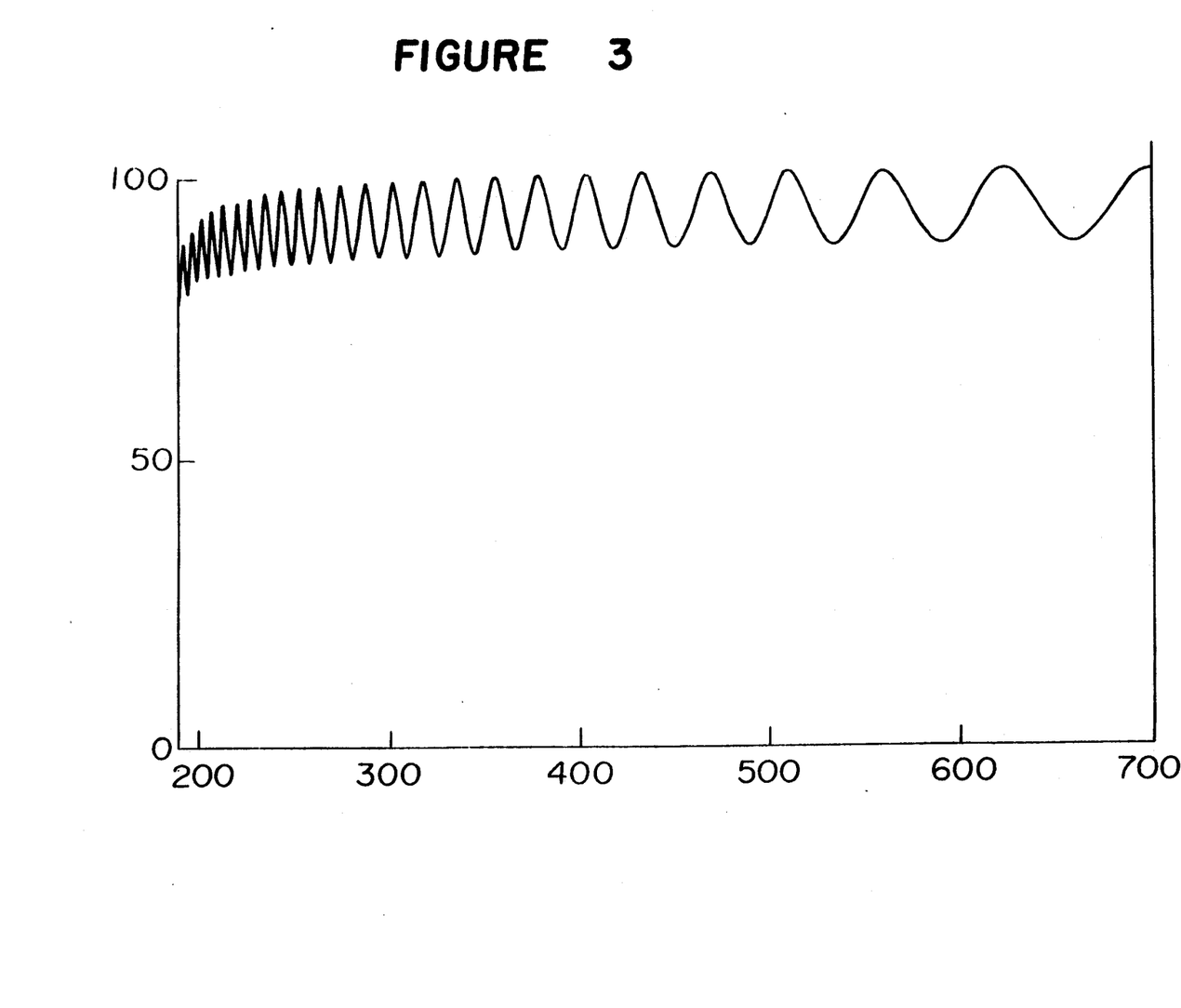
Figure 4:
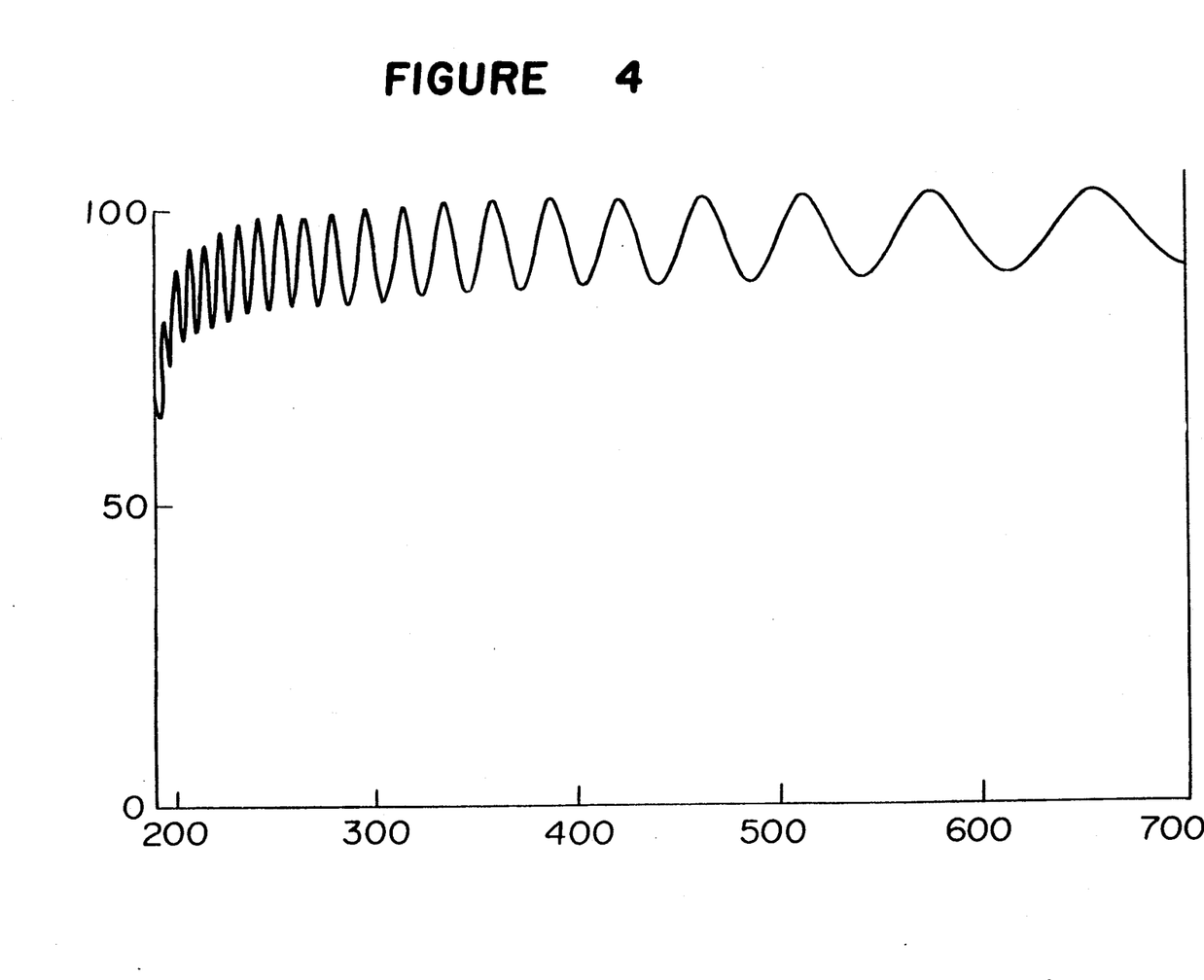
Figure 5:
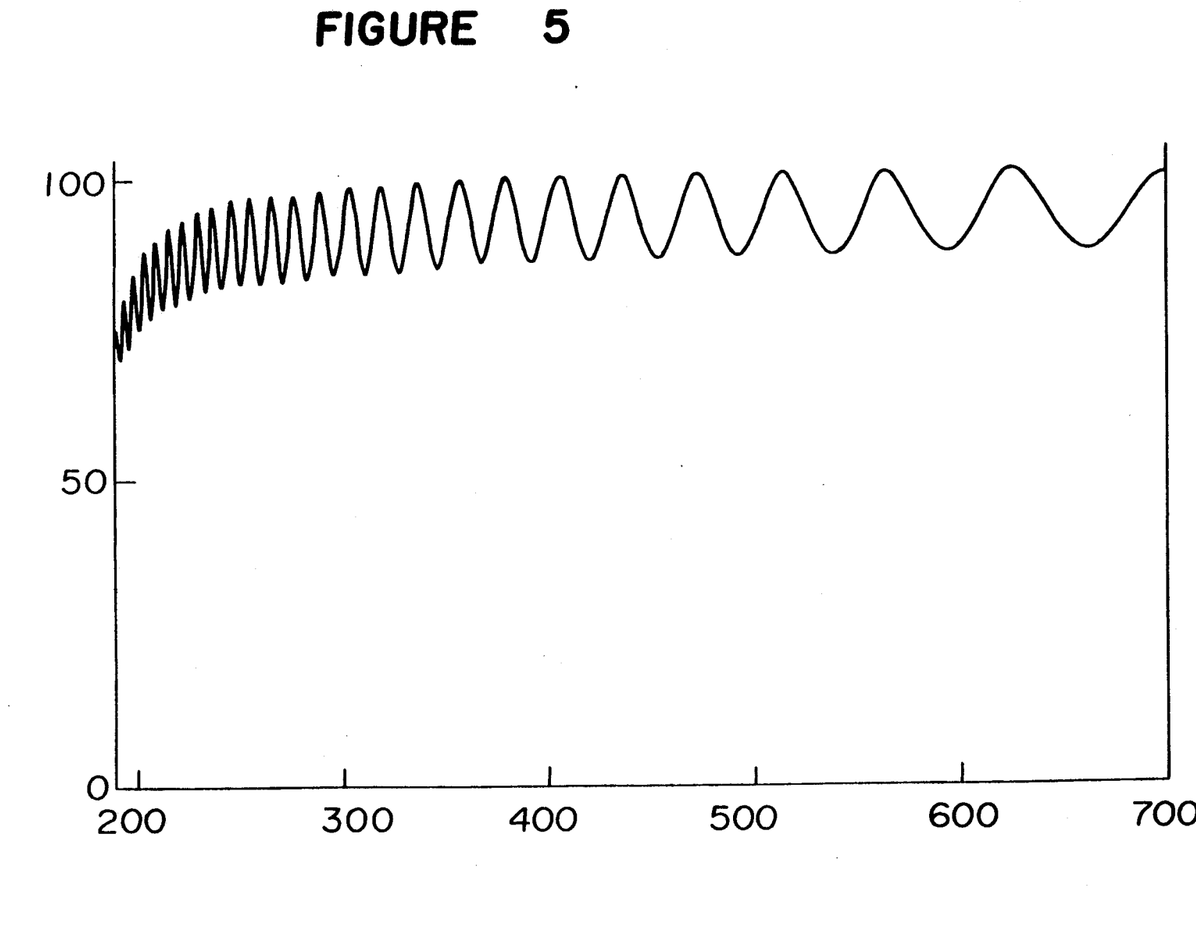

The polyvinyl acetal of the formula I to be used in the present invention can be obtained by subjecting a polyvinyl alcohol to a condensation reaction with acetaldehyde or propionaldehyde, or with two types of aldehydes i.e. butylaldehyde/formaldehyde, butylaldehyde/acetaldehyde, butylaldehyde/propionaldehyde or butylaldehyde/fluorinated aliphatic aldehyde. The two types of aldehydes may be simultaneously or sequentially reacted with the polyvinyl alcohol. However, it is usually preferred to employ a method wherein the two types of aldehydes are preliminarily mixed, and then simultaneously reacted with the polyvinyl alcohol, so as to obtain a polyvinyl mixed acetal having a desired composition in good reproducibility. The condensation reaction of the polyvinyl alcohol with an aldehyde or a mixture of aldehydes is not particularly restricted, and a wide range of conventional methods may be employed for the condensation reaction. For instance, it is possible to employ a method wherein a polyvinyl acetate is used as the starting material and its alcohol, acetic acid or hydrochloric acid solution or its aqueous suspension is saponified and then continuously reacted with the aldehyde or the mixture of aldehydes in the presence of an acid catalyst such as sulfuric acid or hydrochloric acid, or a method wherein a polyvinyl alcohol is used as the starting material, and to its aqueous solution or its dispersion in an alcohol, the aldehyde or the mixture of aldehydes is added and reacted in the presence of an acid catalyst such as sulfuric acid or hydrochloric acid. The method wherein a polyvinyl alcohol is used as the starting material is preferred since the resulting polyvinyl acetal has excellent transparency and the control of the molecular weight and the control of the vinyl acetate content are thereby easy. In this case, the content of the vinyl acetate component in the polyvinyl acetal can be controlled by adjusting the vinyl acetate content in the starting material polyvinyl alcohol. Further, it is possible to obtain polyvinyl acetals having various different compositions and acetal contents by controlling the molar ratio of the vinyl alcohol to the aldehyde or to the mixture of aldehydes, the molar ratio of the two aldehydes in the aldehyde mixture, the reaction time, the reaction temperature and the amount of catalyst.

The fluorine-containing aliphatic aldehyde which may be used in the present invention is an aliphatic aldehyde represented by the following formula II:

$$C_nH_mF_{2n-m+1}CHO \quad (II)$$

wherein n is an integer of from 1 to 8 and m is an integer of from 0 to 2n, i.e. at least one hydrogen in the aliphatic chain is substituted by fluorine. In view of excellent mechanical strength and releasability of the resulting polyvinyl acetal thin film, it is preferred to employ an aliphatic aldehyde wherein all the hydrogen atoms bonded to the terminal carbon atoms of the aliphatic chain are substituted by fluorine atoms, more preferably a perfluoroaliphatic aldehyde wherein all the hydrogen atoms in the aliphatic chain are substituted by fluorine atoms. Such fluorine-containing aliphatic aldehydes include, for example, $CF_3CHO$, $CF_3CH_2CHO$, $CF_3CF_2CHO$, $(CF_3)_2CHCHO$, $CF_3(CF_2)_2CHO$, $(CF_3)_2CFCHO$, $CF_3(CF_2)_3CHO$, $(CF_3CF_2)_2CHCHO$, $CF_3(CF_2)_4CHO$, $CF_3(CF_2)_5CHO$, $CF_3(CF_2)_6CHO$ and $CF_3(CF_2)_7CHO$.

The vinyl acetate content in the polyvinyl acetal used in the present invention is at most 10 mol %, preferably at most 5 mol %. If the vinyl acetate content exceeds this range, the transparency in a far ultraviolet region tends to decrease, and the durability against exposure to ultraviolet rays for a long period of time tends to deteriorate.

The acetal content in the polyvinyl acetal used in the present invention is at least 60 mol %. If the acetal content is less than this range, the thin film made of such a polyvinyl acetal tends to have inadequate releasability from the film-forming substrate. Further, the thin film will have high water absorptivity and is likely to undergo irreversible elongation or fogging at the time of the removal of dust by washing with water. Referring to the formula I, the molar ratio of the butyral component to other acetal component in the polyvinyl mixed acetal i.e. the ratio of z1 to z2 is preferably at most 20:1. If the molar ratio of the butyral component exceeds this range, it tends to be difficult to attain a remarkable improvement in the mechanical strength and releasability of the thin film obtained from such a polyvinyl mixed acetal, as the effects of the present invention.

The thickness of the thin film of the protective dust cover for a mask of the present invention is within a range of from 0.5 to 10 μm. It is meaningless to further reduce the film thickness beyond this range, since the mechanical strength of the film tends to thereby decrease. If the film thickness is thicker than this range, not only the transparency decreases, but also the aberration of light passed through the mask tends to increase, thus adversely affecting the patterning on a wafer.

The protective dust cover is prepared in the form of a film by dissolving the polyvinyl acetal of the formula I in a suitable volatile solvent such as ethanol, methylene chloride, acetone, methyl ethyl ketone, methyl isobutyl ketone, methyl cellosolve, ethyl cellosolve, tetrahydrofuran, dioxane, cyclohexanone, toluene or xylene to obtain a solution, flow-casting the solution on a flat substrate such as a silicon wafer, a glass sheet or a metal plate, followed by evaporating the solvent or by rotating the substrate after the flow-casting to evaporate the solvent. The polyvinyl acetal of the formula I used in the present invention preferably has an average molecular weight within a range of from 10,000 to 200,000. If the molecular weight is less than 10,000, the thin film obtainable from such a polyvinyl acetal tends to have inadequate strength. On the other hand, if the molecular weight exceeds 200,000, the polyvinyl acetal tends to have high viscosity in the form of its solution, whereby it will be difficult to obtain a uniform thin film without irregularities.

As described in the foregoing, the protective dust cover for a mask made of the vinyl acetal of the present invention can readily be prepared in the form of a uniform defectless thin film and has excellent transparency and durability within a wide wavelength region ranging from a near ultraviolent region to a far ultraviolet region and has excellent mechanical strength. Thus, it has excellent film-forming properties, whereby defects such as loosening, wrinkles or rupture hardly form, and the removal of deposited dust is easy, whereby it is possible to prevent a decrease in the yield due to deposition of dust and improve the productivity of semiconductor integrated circuits.

Now, the present invention will be described in further detail with reference to Examples. However, it should be understood that the present invention is by no means restricted to such specific Examples.

Quantitative analysis of the components in the polyvinyl acetal

The weight percentages of the vinyl alcohol component and the vinyl acetate component in the polyvinyl acetal were quantitatively analyzed in accordance with JIS K-6728, and by subtracting the obtained percentages of the two components from 100, the amount of the acetal component was calculated.

Further, the $^{13}$C-NMR spectrum of the polyvinyl acetal was measured by eliminating the nuclear over hauser effect, and the intensity ratio of the peaks of the terminal carbons of the side chains of the acetal components, the molar ratio of the butyral component to other acetal component was obtained. However, with respect to the polyvinyl mixed acetal comprising butylaldehyde and the fluorine-containing aliphatic aldehyde, the molar ratio was calculated from the values obtained by the elemental analysis.

Evaluation of the properties of the protective dust cover for a mask

The polyvinyl acetal was dissolved in ethyl cellosolve and coated on a substrate of 6 inch silicon wafer by means of a spin coater to form a thin film having a thickness of about 2 μm on the silicon wafer. Then, the thin film on the wafer was bonded to an aluminum frame having a peripheral length of 91 mm, a width of 2 mm and a height of 5 mm by means of an epoxy adhesive. Then, the thin film bonded to the aluminum frame was peeled off the wafer to obtain a protective dust cover for a mask.

The protective dust cover thus prepared was inspected for defects such as scratch marks, enlongation, wrinkles or rupture under irradiation by a halogen lamp, and then the transmittance of ultraviolet rays of from 190 to 700 nm was measured by a spectrophotometer (UV-260, manufactured by Shimadzu Corporation), and the center value between the maximum value and the minimum value of the detected Etaroning was taken as the average transmittance of the thin film.

Then, nitrogen gas was blown to the surface of the thin film of the protective dust cover from an air gun (nozzle diameter: 2.0 mm) disposed with a distance of 1 cm from the thin film, to obtain the pressure at rupture of the thin film.

For the ultraviolet durability of the protective dust cover, the thin film of the protective dust cover was exposed continuously for 6 hours to ultraviolet rays from a 500W xenon-mercury lamp disposed with a distance of 10 cm from the thin film, whereby the change of the thin film was observed.

EXAMPLES 1 and 2

35 g of completely saponified polyvinyl alcohol (average degree of polymerization: 1,000) was dispersed in 1 liter of 95% methanol, and 36% hydrochloric acid and a mixture of butylaldehyde and acetaldehyde were added thereto. Then, the mixture was reacted firstly at 40° C. and then at 60° C. for conversion to acetal. After completion of the reaction, the reaction solution was neutralized by an addition of sodium acetate and then poured into water. Precipitated white solid was collected by filtration. The reaction conditions and the vinyl acetate content and the acetal content in the obtained polyvinyl mixed acetal are shown in Table 1.

The infrared absorption spectrum and the $^{13}$C-NMR spectrum of the obtained polyvinyl mixed acetal were as follows. Infrared spectrum (cm$^{-1}$): 2950(s), 2862(s), 1715(w), 1427(m), 1408(m), 1378(s), 1340(m), 1238(m), 1135(s), 1052(m), 1000(s), 809(w), 760(w), 740(w), 663(w)

$^{13}$C-NMR Spectrum δ (CDCl$_3$, ppm): 14.0, 17.9, 21.5, 34.4, 35.0, 37.2, 42.0, 43.4, 65.5, 68.2, 72.8, 73.8, 74.0, 91.8, 98.3, 94.4, 102.0.

Twenty protective dust covers for a mask were prepared by using the obtained polyvinyl mixed acetal and inspected for the presence or absence of defects such as scratch marks, elongation, wrinkles or rupture, whereby the percentage of the number of the protective dust covers with no defect observed was taken as the yield.

The yield, the average transmittance at 300 nm, the pressure at rupture by an air gun and the change after exposure to ultraviolet rays of the protective dust covers thus prepared are shown in Table 3.

EXAMPLES 3 to 5

35 g of completely saponified polyvinyl alcohol (average degree of polymerization: 1000) was dispersed in 1 liter of 95% methanol, and 36% hydrochloric acid and mixture of butylaldehyde and propionaldehyde were added thereto. The mixture was reacted at 60° C. for conversion to acetal. After completion of the reaction, the reaction solution was neutralized by an addition of sodium acetate and then poured into water. Precipitated white solid was collected by filtration. The reaction conditions and the vinyl acetate content and the acetal content in the obtained polyvinyl mixed acetal are shown in Table 1.

The infrared absorption spectrum and the $^{13}$C-NMR spectrum of the obtained polyvinyl mixed acetal were as follows:

Infrared Absorption Spectrum (cm$^{-1}$): 2950(s), 2860(s), 1715(w), 1461(m), 1430(m), 1405(m), 1378(s), 1342(m), 1238(m), 1130(s), 1000(s), 975(s), 904(m), 875(m), 825(w), 762(w), 678(w)

$^{13}$C-NMR Spectrum δ (CDCl$_3$, ppm): 8.3, 14.1, 17.9, 28.1, 34.3, 34.7, 37.6, 42.0, 43.4, 65.5, 68.2, 73.0, 73.8, 74.0, 94.8, 103.2.

Protective dust covers for a mask were prepared in the same manner as in Example 1 by using the obtained polyvinyl mixed acetal, and the production yield, the average transmittance at 300 nm, the pressure at rupture by an air gun and the change after exposure to ultraviolet rays are shown in Table 3.

EXAMPLE 6

30 g of completely saponified polyvinyl alcohol (average degree of polymerization: 1000) was dispersed in 600 ml of 95% ethanol, and 36% hydrochloric acid and a mixture of butylaldehyde and nonafluoropentylaldehyde C$_4$F$_9$CHO were added thereto. The mixture was reacted at 60° C. for conversion to acetal. After completion of the reaction, the reaction solution was neutralized by an addition of sodium acetate and then poured into water. Precipitated white solid was collected by filtration. The reaction conditions and the vinyl acetate content and the acetal content in the obtained polyvinyl mixed acetal are shown in Table 1.

The infrared absorption spectrum, the $^{13}$C-NMR spectrum and the elemental analysis of the obtained polyvinyl mixed acetal were as follows.

Infrared Absorption Spectrum (cm$^{-1}$): 2950(s), 2860(s), 1710(w), 1452(m), 1425(m), 1408(m), 1374(s), 1338(m), 1237(m), 1135(s), 1047(m), 1000(s), 905(m), 890(m), 802(m), 755(w), 738(w), 678(w)

$^{13}$C-NMR Spectrum δ (CDCl$_3$, ppm): 13.2, 16.4, 33.7, 34.5, 36.2, 36.6, 37.4, 41.7, 42.0, 43.5, 44.0, 62.5, 63.0, 63.3, 67.4, 71.7, 72.5, 86.0, 93.6, 100.2.

Elemental Analysis: C: 59.8; H: 8.6; F: 8.2%

Protective dust covers for a mask were prepared in the same manner as in Example 1 by using the obtained polyvinyl mixed acetal, and the production yield, the average transmittance at 300 nm, the pressure at rupture by an air gun and the change after exposure to ultraviolet rays are shown in Table 3.

EXAMPLES 7 and 8

50 g of completely saponified polyvinyl alcohol (average degree of polymerization: 1000) was dispersed in 1 liter of 95% methanol, and 36% hydrochloric acid and acetaldehyde were added. Then, the mixture was reacted at 30° C. for conversion to acetacetal. After completion of the reaction, the reaction solution was neutralized by an addition of sodium acetate an then poured into water. Precipitated white solid was collected by filtration. The reaction conditions and the vinyl acetate content and the acetal content in the obtained polyvinyl acetacetal are shown in Table 2.

The protective dust covers for a mask were prepared in the same manner as in Example 1 by using the obtained polyvinyl acetacetal, and the production yield, the average transmittance at 300 nm, the pressure at rupture by an air gun and the change after exposure to ultraviolet rays are shown in Table 3.

EXAMPLES 9 to 11

50 g of completely saponified polyvinyl alcohol (average degree of polymerization: 1000) was dispersed in 1 liter of 95% methanol, and 36% hydrochloric acid and propionaldehyde were added thereto. Then, the mixture was reacted at 60° C. for conversion to propional. After completion of the reaction, the reaction solution was neutralized by an addition of sodium acetate and then poured into water. Precipitated white solid was collected by filtration. The reaction conditions an vinyl acetate content and the acetal content in the obtained polyvinyl propional are shown in Table 2.

Protective dust covers for a mask were prepared in the same manner as in Example 1 by using the obtained polyvinyl propional, and the production yield, the average transmittance at 300 nm, the pressure at rupture by an air gun and the change after exposure to ultraviolet rays were as shown in Table 3.

COMPARATIVE EXAMPLE

Protective dust covers for a mask were prepared in the same manner as in Example 1 by using polyvinyl butyral (Butvar B-79; acetal content: 88%, manufactured by Monsant) and the production yield, the average transmittance at 300 nm, the pressure at rupture by an air gun and the change after exposure to ultraviolet rays were as shown in Table 3.

From the foregoing, it should be apparent that the protective dust covers for a mask made of the polyvinyl acetals of the present invention are excellent protective dust covers having all the required properties.

TABLE 1

| Example | Amount of HCl (ml) | Amount of aldehyde (g) (1) | (2) | Reaction time (hr) | Vinyl acetate content (mol %) | Acetal content (mol %) | Ratio of Acetals* |
|---|---|---|---|---|---|---|---|
| 1 | 50 | 110 | 68 | 18 | 0.41 | 81 | 55/45 |
| 2 | 50 | 146 | 45 | 18 | 0.20 | 81 | 70/30 |
| 3 | 50 | 110 | 88 | 14 | 0.46 | 77 | 47/53 |
| 4 | 50 | 146 | 59 | 14 | 0.39 | 78 | 61/39 |
| 5 | 20 | 72 | 29 | 19 | 0.45 | 72 | 63/37 |
| 6 | 12 | 49 | 25 | 15 | 0.35 | 69 | 91/9 |

(1) Butylaldehyde
(2) Acetaldehyde (Examples 1 and 2), Propionaldehyde (Examples 3–5), Nonafluoropentylaldehyde (Example 6)
*Molar ratio of butyral component/other acetal component

TABLE 2

| Example | Amount of HCl (ml) | Amount of aldehyde (g) | Reaction time (hr) | Vinyl acetate content (mol %) | Acetal content (mol %) |
| --- | --- | --- | --- | --- | --- |
| 7 | 50 | 250 | 24 | 0.43 | 84 |
| 8 | 50 | 125 | 24 | 0.47 | 74 |
| 9 | 50 | 250 | 3 | 0.79 | 81 |
| 10 | 20 | 73 | 3 | 0.53 | 72 |
| 11 | 10 | 73 | 3 | 1.19 | 66 |

TABLE 3

|  | Yield (%) | Average transmittance at 300 nm (%) | Pressure at rupture (kg/cm²) | Change after exposure to ultra-violet rays |
| --- | --- | --- | --- | --- |
| Example 1 | 100 | 91.8 | 5.0 | No change |
| Example 2 | 95 | 91.7 | 4.5 | No change |
| Example 3 | 100 | 91.9 | 5.0 | No change |
| Example 4 | 100 | 91.4 | 4.5 | No change |
| Example 5 | 95 | 91.0 | 4.5 | No change |
| Example 6 | 100 | 92.0 | 4.0 | No change |
| Example 7 | 95 | 91.4 | 4.5 | No change |
| Example 8 | 100 | 91.0 | 5.0 | No change |
| Example 9 | 95 | 92.0 | 4.5 | No change |
| Example 10 | 100 | 91.1 | 4.5 | No change |
| Example 11 | 100 | 91.0 | 5.0 | No change |
| Comparative Example | 20 | 91.0 | Elongation observed at 2.5 | No change |

We claim:

1. A protective dust cover for a photomask or reticle useful for forming semiconductor integrated circuits, which is a transparent film cover to be disposed with a certain distance from the substrate surface of the photomask or reticle for the protection and dust proof of the substrate surface, said transparent film consisting essentially of a polyvinyl acetal of the formula:

wherein R is $-C_2H_5$ or $-C_nH_mF_{2n-m+1}$ wherein n is an integer of from 1 to 8 and m is an integer of from 0 to 2n, x is a number of from 5 to 40, y is a number of from 0 to 10, z1 is a number of from 0 to 90/2, and z2 is a number of from 3/2 to 95/2, having a vinyl acetate content of at most 10 mol % and an acetal content of at least 60 mol %.

2. The protective dust cover according to claim 1, wherein R is $-CH_3$ or $-C_2H_5$ and z1 is 0.

3. The protective dust cover according to claim 1, wherein the ratio of z1 to z2 is at most 20:1.

4. The protective dust cover according to claim 1, wherein the transparent thin film cover has a thickness of from 0.5 to 10 μm.

* * * * *